United States Patent [19]

Ashtaputre et al.

[11] Patent Number: 5,399,517
[45] Date of Patent: Mar. 21, 1995

[54] METHOD OF ROUTING THREE LAYER METAL GATE ARRAYS USING A CHANNEL ROUTER

[75] Inventors: Sunil Ashtaputre, San Jose; Mark Hartoog, Los Gatos; Kieu-Huong Do; Prasad Sakhamuri, both of San Jose; Charles Ng, Belmont, all of Calif.

[73] Assignee: VLSI Technology, Inc., San Jose, Calif.

[21] Appl. No.: 838,381

[22] Filed: Feb. 19, 1992

[51] Int. Cl.6 .............................................. H01L 21/70
[52] U.S. Cl. ........................................ 437/51; 437/195; 257/211; 257/909
[58] Field of Search ........................... 437/50, 51, 915; 257/210–211, 909

[56] References Cited

U.S. PATENT DOCUMENTS

| | | | |
|---|---|---|---|
| 4,745,084 | 5/1988 | Rowson et al. | 437/51 |
| 5,084,404 | 1/1992 | Sharpe-Geisler | 437/51 |
| 5,227,324 | 7/1993 | Fujimoto et al. | 437/51 |
| 5,275,962 | 1/1994 | Hashimoto | 437/48 |

FOREIGN PATENT DOCUMENTS

| | | | |
|---|---|---|---|
| 0314376 | 5/1989 | European Pat. Off. | 437/51 |
| 61-230334 | 10/1986 | Japan | 437/51 |

OTHER PUBLICATIONS

Sabih H. Gerez and Otto E. Herrmann, "Cracker: A General Area Router Based on Stepwise Reshaping", IEEE, 1989, pp. 44–47.

Charles H. Ng, "An Industrial World Channel router for Non-rectangular Channels", 23rd Design Automation Conference, IEEE 1986, pp. 490–494.

Wei-Ming Dai, Tetsuo Asano and Ernest S. Kuh, "Routing Region Definition and Ordering Scheme for Building-Block Layout", IEEE Transactions on Computer-Aided Design, Jul. 1985, pp. 189–197.

G. Meixner and U. Lauther, "A New Global Router Based on a Flow Model and Linear Assignment", IEEE, 1990, pp. 44–47.

*Primary Examiner*—Olik Chaudhuri
*Assistant Examiner*—Richard A. Booth
*Attorney, Agent, or Firm*—Douglas L. Weller

[57] ABSTRACT

In a method for providing routing between logic cells, the logic cells are arranged in rows. Intercell connectors within each row of logic cells are aligned, for example in the middle of the rows, to form channel boundaries. The intercell connectors are then channel routed in metal layers above the logic cells. Alternately, intercell connectors are placed within the logic cells, however, these intercell connectors are not necessarily aligned. For each intercell connector which is not on a boundary of a routing channel, a substitute connector is located at the boundary of a routing channel. The substitute connectors and the intercell connectors which are on the boundaries of the routing channels are channel routed. Length of routing segments are then adjusted to substitute connectors to extend to intercell connectors instead of the substitute connectors.

8 Claims, 9 Drawing Sheets

METHOD OF ROUTING THREE LAYER METAL GATE ARRAYS USING A CHANNEL ROUTER

BACKGROUND

The present invention concerns using a channel router to route connection networks in very large scale integrated (VLSI) circuits constructed using three layer metal gate array technology.

After logic circuitry for a VLSI circuit has been designed, placement algorithms are used to place the VLSI circuit logic efficiently upon a chip. For example, in gate array logic, logic cells are placed in logic circuitry rows. Intercell connectors for the logic cells are connected together with wire network. The wire networks are formed of layers of metal placed on the chip.

For example, in two layer metal gate array circuitry, logic cells are generally placed in logic circuitry rows separated by routing channels. Intercell connectors for the cells are placed at the boundary of a routing channel. A channel router is then used to connect networks of intercell connectors. The channel router routes wires within the routing channels so that a first layer of metal is used for wires running parallel to the routing channel (horizontal wires) and a second layer of metal is used for wires running perpendicular to the routing channel (vertical wires). Herein, wires running parallel to a routing channel or row are considered to be horizontal. Wires running perpendicular to a routing channel or row are considered to be vertical.

Channel routers require that intercell connectors be located at the boundaries of the routing channels. This serves to limit the complexity of design of channel routers as well as providing for quality routes.

In three layer metal gate array circuitry, space on the integrated circuit is used more efficiently by eliminating routing channels between logic circuitry rows. Instead, intercell routing is performed using the top two layers of metal (The bottom layer of metal is used in the implementation of the logic cells). Intercell connectors, i.e., pins, from the logic cells extend into the first metal layer. An area router is used to route the wires between the intercell connectors. Similar to channel routers, an area router routes wires so that a first layer of metal is used for wires running parallel to the logic circuitry rows (horizontal wires) and a second layer of metal is used for wires running perpendicular to the routing channel (vertical wires).

Area routers are generally more complex to implement than channel routers. This is because area routers need to be able to route pins which are randomly distributed. The increased complexity of area routers additionally results in the generation of routes which are placed inferiorly as compared to placements of routes by channel routers.

SUMMARY OF THE INVENTION

In accordance with the preferred embodiment of the present invention, a method is presented for providing routing between logic cells. The logic cells are arranged in rows. Intercell connectors within each row of logic cells are aligned, for example in the middle of the rows, to form channel boundaries. The intercell connectors are then channel routed in metal layers above the logic cells.

In an alternate embodiment of the present invention, boundaries of a plurality of routing channels are defined to be placed in two metal layers above rows of logic cells. Intercell connectors are placed within the logic cells, however, these intercell connectors are not necessarily aligned. For each intercell connector which is not on a boundary of a routing channel, a substitute connector is located at the boundary of a routing channel. The substitute connectors and the intercell connectors which are on the boundaries of the routing channels are channel routed. Length of routing segments are then adjusted to substitute connectors to extend to intercell connectors instead of the substitute connectors.

When a first substitute connector is routed within a first routing channel from the plurality of routing channels, and the first substitute connector is projected from a first intercell connector which is located in a second routing channel, a projected routing path from the first substitute connector to the intercell connector is treated as an obstacle when routing the second routing channel.

The present invention provides for channel routing in three layer metal designs. The decreased complexity of channel routers, verses area routers, results in easier router design, faster routing, and the generation of routes which are often superior.

DESCRIPTION OF THE PRIOR ART

Figure 1:
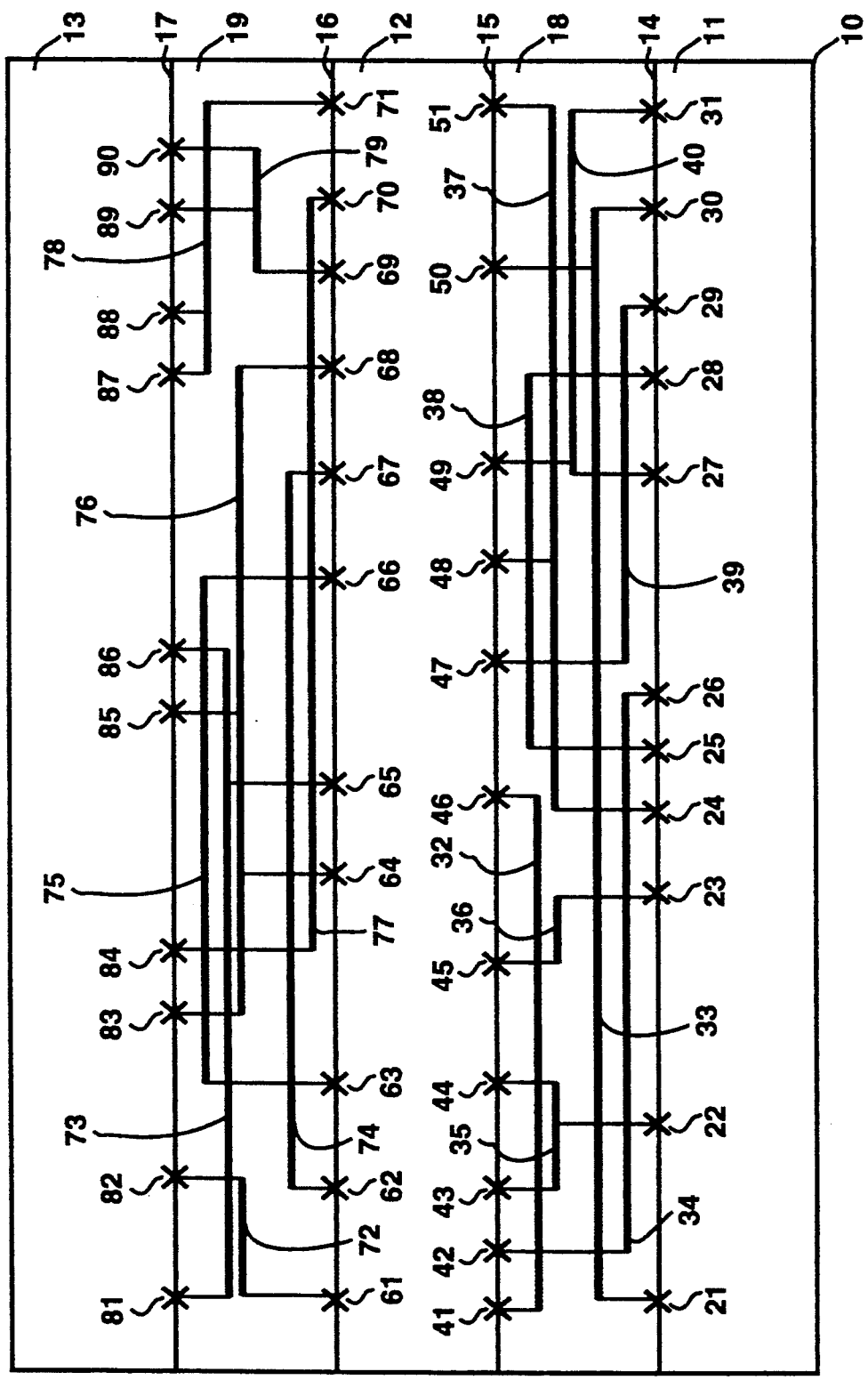
FIG. 1 is a simplified block diagram which illustrates wire routing in a routing channel in accordance with the prior art.

FIG. 1 shows a simplified block diagram of a portion of an integrated circuit 10 which is implemented using two layer metal gate array technology. Logic circuitry of integrated circuit 10 is arranged in logic circuitry rows. For example, a logic circuitry row 11, a logic circuitry row 12 and a logic circuitry row 13 are shown.

Intercell connections between logic circuitry rows are routed within routing channels. For example, a routing channel 18 and routing channel 19 are shown.

Intercell connections are placed along boundaries of the logic circuit row, adjacent to the routing channels. For example, along a boundary 14 of logic circuitry row 11, adjacent to routing channel 18, are placed an intercell connector 21, an intercell connector 22, an intercell connector 23, an intercell connector 24, an intercell connector 25, an intercell connector 26, an intercell connector 27, an intercell connector 28, an intercell connector 29, an intercell connector 30 and an intercell connector 31. Similarly, along a boundary 15 of logic circuitry row 12, adjacent to routing channel 18, are placed an intercell connector 41, an intercell connector 42, an intercell connector 43, an intercell connector 44, an intercell connector 45, an intercell connector 46, an intercell connector 47, an intercell connector 48, an intercell connector 49, an intercell connector 50 and an intercell connector 51. Along a boundary 16 of logic circuitry row 12, adjacent to routing channel 19, are placed an intercell connector 61, an intercell connector 62, an intercell connector 63, an intercell connector 64, an intercell connector 65, an intercell connector 66, an intercell connector 67, an intercell connector 68, an intercell connector 69, an intercell connector 70 and an intercell connector 71. Along a boundary 17 of logic circuitry row 13, adjacent to routing channel 19, are placed an intercell connector 81, an intercell connector 82, an intercell connector 83, an intercell connector 84, an intercell connector 85, an intercell connector 86, an intercell connector 87, an intercell connector 88, an intercell connector 89, an intercell connector 90 and an intercell connector 91.

Within the routing channels, the intercell connectors are interconnected using two layers of metal. Wires in a first metal layer connect to the intercell connector and extend in a horizontal direction, that is perpendicular to the direction routing channels. Wires in a second metal layer run in a vertical direction, that is parallel to the direction of the routing channels. Wires in the second metal layer, through contacts, interconnect wires in the first metal layer.

For example, in routing channel 18, a wire 32 in the first metal layer is used to connect intercell connectors 41 and 46. A wire 33 in the first metal layer is used to connect intercell connectors 21, 30 and 50. A wire 34 in the first metal layer is used to connect intercell connectors 26 and 42. A wire 35 in the first metal layer is used to connect intercell connectors 22, 43 and 44. A wire 36 in the first metal layer is used to connect intercell connectors 23 and 45. A wire 37 in the first metal layer is used to connect intercell connectors 24, 48 and 51. A wire 38 in the first metal layer is used to connect intercell connectors 25 and 28. A wire 39 in the first metal layer is used to connect intercell connectors 29 and 47. A wire 40 in the first metal layer is used to connect intercell connectors 27, 31 and 49.

Similarly, in routing channel 19, A wire 72 in the first metal layer is used to connect intercell connectors 61 and 82. A wire 73 in the first metal layer is used to connect intercell connectors 65, 85 and 86. A wire 74 in the first metal layer is used to connect intercell connectors 62 and 67. A wire 75 in the first metal layer is used to connect intercell connectors 63 and 66. A wire 76 in the first metal layer is used to connect intercell connectors 64, 68, 83 and 86. A wire 77 in the first metal layer is used to connect intercell connectors 70 and 84. A wire 78 in the first metal layer is used to connect intercell connectors 71, 87 and 88. A wire 79 in the first metal layer is used to connect intercell connectors 69, 89 and 90.

While FIG. 1 shows an extremely simplified block diagram with few intercell connectors and a crude routing pattern, fairly sophisticated channel routers are available in the prior art. See for example, Charles H. Ng, *An Industrial World Channel router for Non-rectangular Channels*, 23rd Design Automation Conference, IEEE 1986, pp. 490–494; and, Wei-Ming Dai, Tetsuo Asano and Ernest S. Kuh, *Routing Region Definition and Ordering Scheme for Building-Block Layout*, IEEE Transactions on Computer-Aided Design, July 1985, pp. 189–197.

Figure 2:
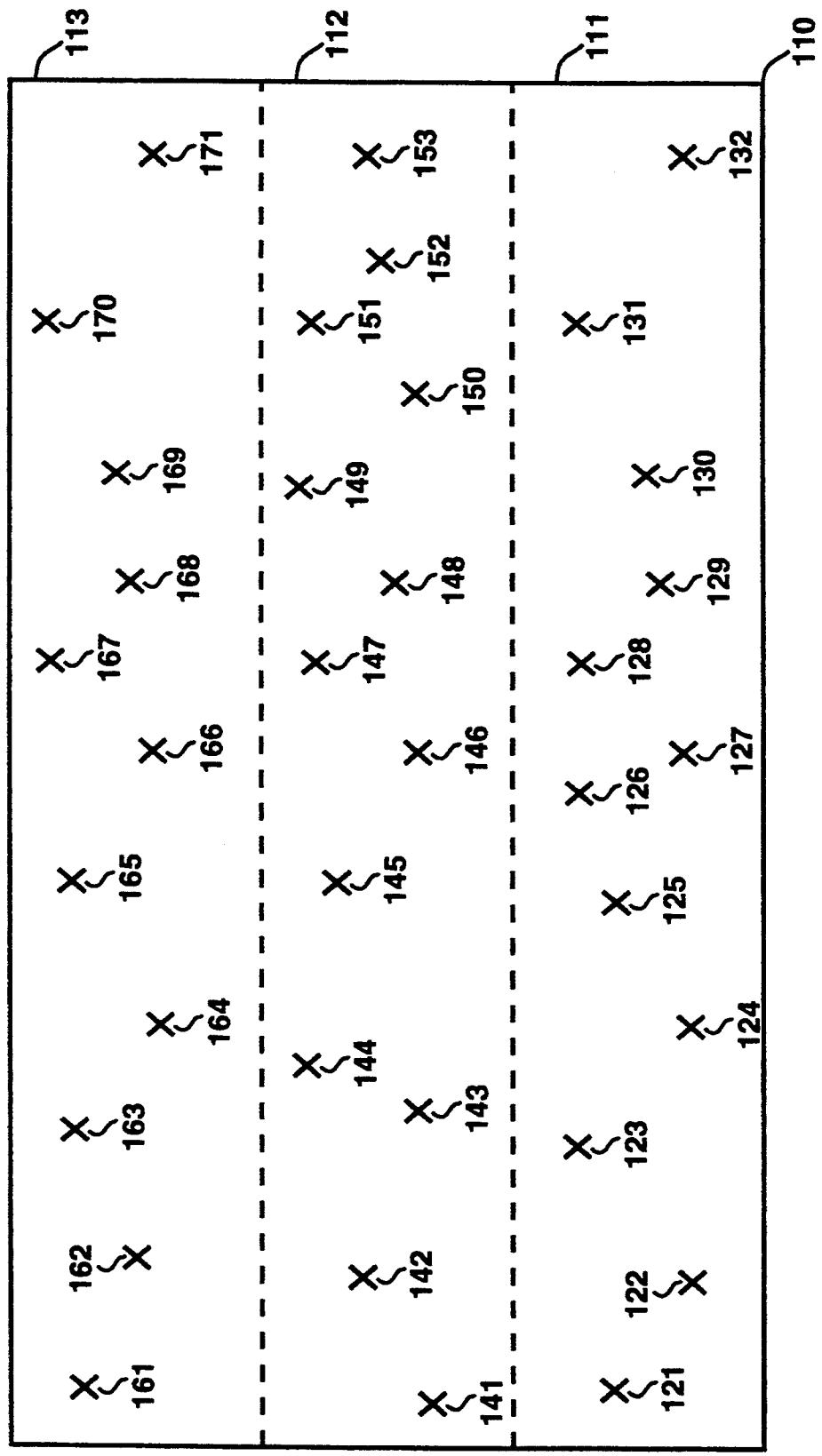
FIG. 2 is a simplified block diagram which illustrates the random location of intercell connectors in an integrated circuit implemented using three layer metal gate array technology in accordance with the prior art.

FIG. 2 shows a simplified block diagram of a portion of an integrated circuit 110 which is implemented using three layer metal gate array technology. Logic circuitry of integrated circuit 110 is arranged in logic circuitry rows. For example, a logic circuitry row 111, a logic circuitry row 112 and a logic circuitry row 113 are shown. Intercell connections between logic circuitry rows are routed in two metal layers which are placed on top of the logic circuitry rows.

Intercell connections are interspersed within the logic circuitry rows. For example, within logic circuitry row 111 are placed an intercell connector 121, an intercell connector 122, an intercell connector 123, an intercell connector 124, an intercell connector 125, an intercell connector 126, an intercell connector 127, an intercell connector 128, an intercell connector 129, an intercell connector 130, an intercell connector 131 and an intercell connector 132. Similarly, within logic circuitry row 112 are placed an intercell connector 141, an intercell connector 142, an intercell connector 143, an intercell connector 144, an intercell connector 145, an intercell connector 146, an intercell connector 147, an intercell connector 148, an intercell connector 149, an intercell connector 150, an intercell connector 151, an intercell connector 152 and an intercell connector 153. Within logic circuitry row 113 are placed an intercell connector 161, an intercell connector 162, an intercell connector 163, an intercell connector 164, an intercell connector 165, an intercell connector 166, an intercell connector 167, an intercell connector 168, an intercell connector 169, an intercell connector 170 and an intercell connector 171.

Figure 3:
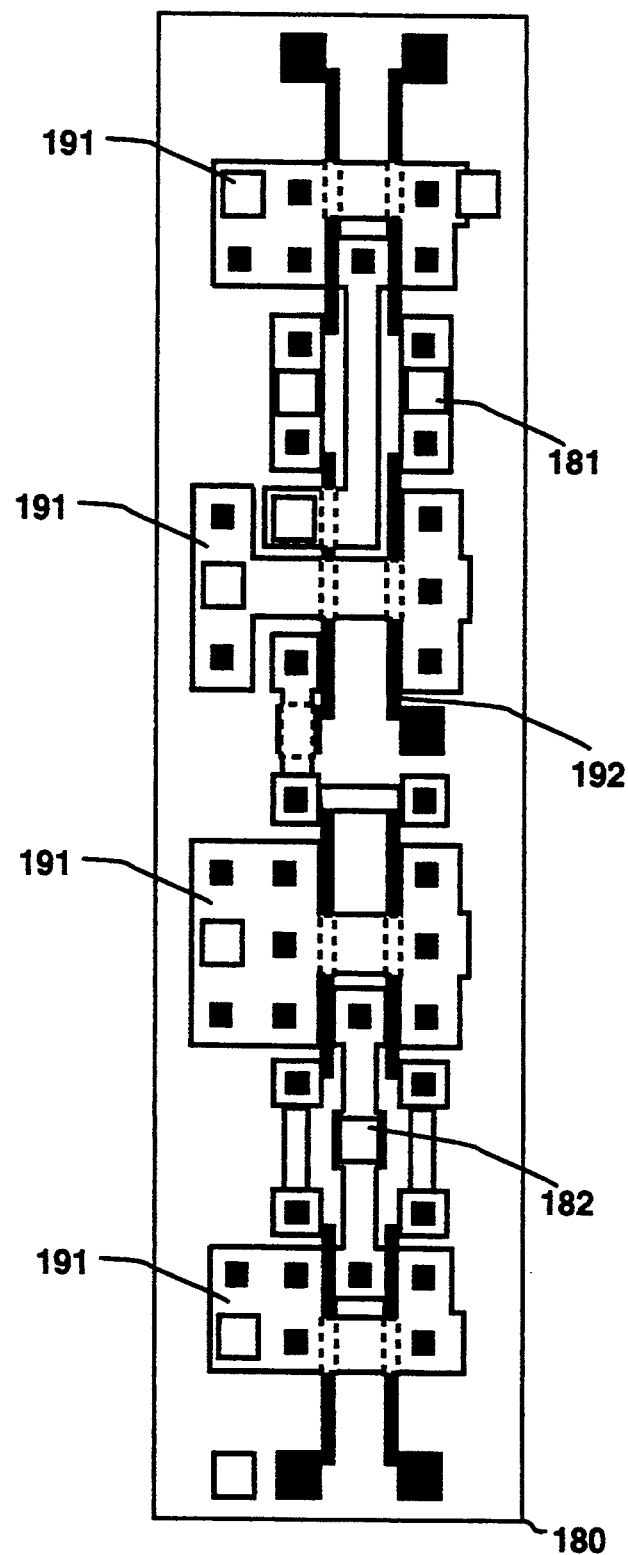
FIG. 3 is a simplified diagram of a logic cell which illustrates the random location of intercell connectors within the random cell in accordance with the prior art.

FIG. 3 shows a logic cell 180, which is typical of logic cells utilized in the prior art as part of a logic circuitry row. Within logic cell 180, logic circuitry 191 performs the logic function of logic cell 180. Logic cell 180 has an intercell connector 181 and an intercell connector 182. Intercell connector 181 and intercell connector 182 are used as an interface to other logic cells. As is seen from FIG. 3, intercell connector 181 and intercell connector 182 are placed within logic cell 180 at random locations.

Intercell connectors, such as those shown in FIG. 2 and FIG. 3, are routed together into networks using an area router. An area router can network intercell connector pins which are anywhere in the routing region. For an example of an area router, see G. Meixner and U. Lauther, *A New Global Router Based on a Flow Model and Linear Assignment*, IEEE, 1990, pp. 44–47; or, Sabih H. Gerez and Otto E. Herrmann, *CRACKER: A General Area Router Based on Stepwise Reshaping*, IEEE, 1989, pp. 44–47. As discussed above, area routers are generally more complex to implement than channel routers. The increased complexity of area routers make them difficult to implement. Further, area routers often generate routes which are of lower quality than routes generated by channel routers.

DESCRIPTION OF THE PREFERRED EMBODIMENT

Figure 4:
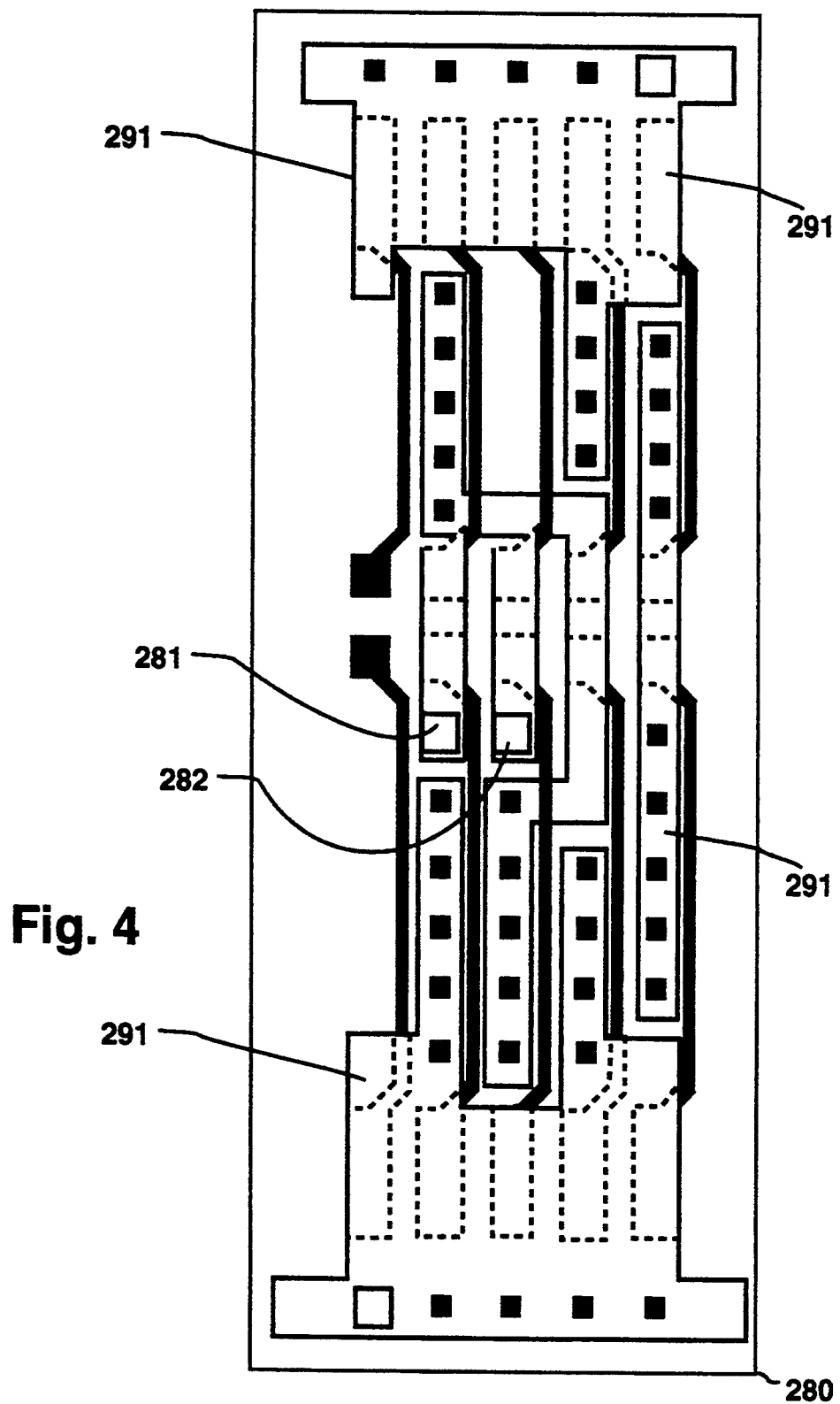
FIG. 4 is a simplified diagram of a logic cell which illustrates the regular location of intercell connectors within a logic cell in accordance with the preferred embodiment of the present invention.

In a first embodiment of the present invention, intercell connectors are placed within logic cells so that within a logic circuitry row, all intercell connectors are aligned. For example, FIG. 4 shows a logic cell 280. Within logic cell 280, logic circuitry 291 performs the logic function of logic cell 280. Logic cell 280 has an intercell connector 281 and an intercell connector 282 which are used as an interface to other logic cells. As is seen from FIG. 4, intercell connector 281 and intercell connector 282 are aligned in the horizontal direction.

Figure 5:
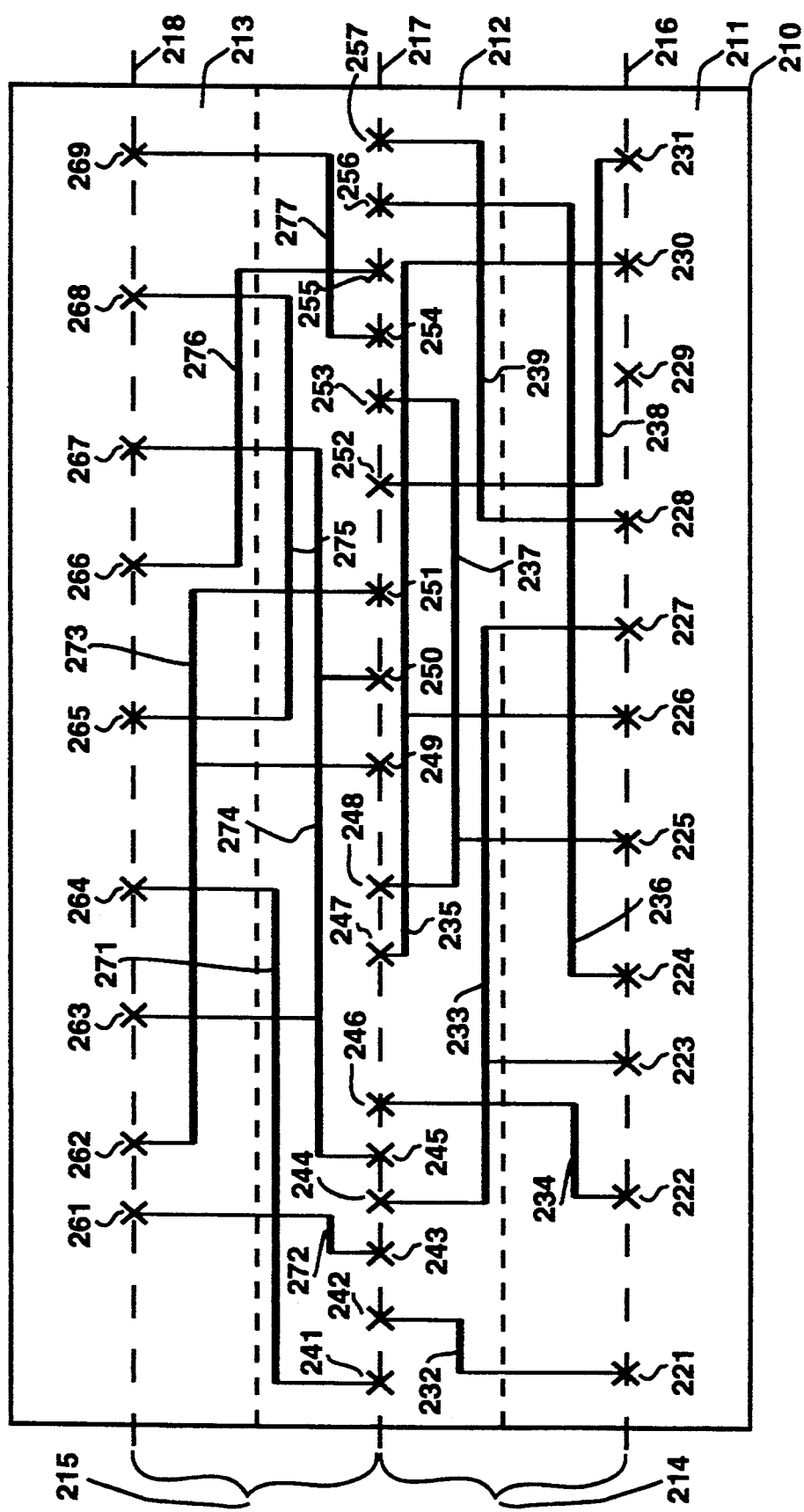
FIG. 5 is a simplified block diagram which illustrates wire routing along defined routing channels in accordance with a preferred embodiment of the present invention.

Similarly, FIG. 5 shows an integrated circuit 210 which is implemented using three layer metal gate array technology. Logic circuitry of integrated circuit 210 is arranged in logic circuitry rows. For example, a logic circuitry row 211, a logic circuitry row 212 and a logic circuitry row 213 are shown. Intercell connections between logic circuitry rows are routed in two metal layers which are placed on top of the logic circuitry rows.

Intercell connections within each logic circuitry row are aligned in a direction parallel to the row. The aligned intercell connectors form the boundary of a routing channel.

For example, within logic circuitry row 211, an intercell connector 221, an intercell connector 222, an intercell connector 223, an intercell connector 224, an intercell connector 225, an intercell connector 226, an intercell connector 227, an intercell connector 228, an intercell connector 229, an intercell connector 230, and an intercell connector 231 are aligned on a channel boundary 216. Similarly, within logic circuitry row 212, an intercell connector 241, an intercell connector 242, an intercell connector 243, an intercell connector 244, an intercell connector 245, an intercell connector 246, an intercell connector 247, an intercell connector 248, an intercell connector 249, an intercell connector 250, an intercell connector 251, an intercell connector 252, an intercell connector 253, an intercell connector 254, an intercell connector 255, an intercell connector 256 and an intercell connector 257 are aligned on a channel boundary 217. Within logic circuitry row 213, an intercell connector 261, an intercell connector 262, an intercell connector 263, an intercell connector 264, an intercell connector 265, an intercell connector 266, an intercell connector 267, an intercell connector 268 and an intercell connector 269 are aligned on a channel boundary 218.

Routing channels are defined which extend between the channel boundaries formed by the aligned intercell connectors. For example a routing channel 214 is defined between channel boundary 216 and channel boundary 217. A routing channel 215 is defined between channel boundary 217 and channel boundary 218.

A channel router may then be used to route intercell connectors within routing channel 214 and routing channel 215. For example, in routing channel 214, a horizontal routing segment 232, a horizontal routing segment 233, a horizontal routing segment 234, a horizontal routing segment 235, a horizontal routing segment 236, a horizontal routing segment 237, a horizontal routing segment 238 and a horizontal routing segment 239 are shown. These horizontal routing segments are used to connect intercell connectors in logic circuitry row 211 with intercell connectors in logic circuitry row 212. Similarly, in routing channel 215, a horizontal routing segment 271, a horizontal routing segment 272, a horizontal routing segment 273, a horizontal routing segment 274, a horizontal routing segment 275, a horizontal routing segment 276 and a horizontal routing segment 277 are shown. These horizontal routing segments are used to connect intercell connectors in logic circuitry row 212 with intercell connectors in logic circuitry row 213.

In FIG. 5, all the intercell connectors in logic circuitry row 211 are routed through routing channel 214. Similarly, all the intercell connectors in logic circuitry row 213 are routed through routing channel 215. However, a portion of the intercell connectors in logic circuitry row 212 are routed through routing channel 214 and a portion of the intercell connectors in logic circuitry row 212 are routed through routing channel 215. In FIG. 5, all the intercell connectors in logic circuitry row 212 are aligned along channel boundary 217. However, in an alternate embodiment, the intercell connectors in logic circuitry row 212 may be aligned to form separate boundaries: one boundary contains the intercell connectors which are routed through routing channel 214 and the other boundary containing the intercell connectors which are routed through routing channel 215.

In an alternate embodiment of the present invention, it is recognized that it is not always a simple matter to place intercell connectors within logic cells so that within a logic circuitry row, all intercell connectors are aligned. In the alternate preferred embodiment, therefore, a routing channel with boundaries is defined. Those intercell connectors which are not at the routing channel boundary are vertically projected to the routing channel boundary. A channel router is then used to route the intercell connectors which are on the routing channel boundary and the projected intercell connectors which are projected to the routing channel boundary.

For each intercell connector that is vertically projected to the routing channel boundary, if the intercell is within the routing channel being routed, the projected vertical routing segment is ignored when the routing is completed. If the intercell connector is outside the routing channel being routed, the projected vertical routing segment is used as part of the final routing. If the projected vertical routing segment extends into another routing channel, the projected vertical routing segment is regarded as an obstacle within the routing channel and routed around.

Figure 6:
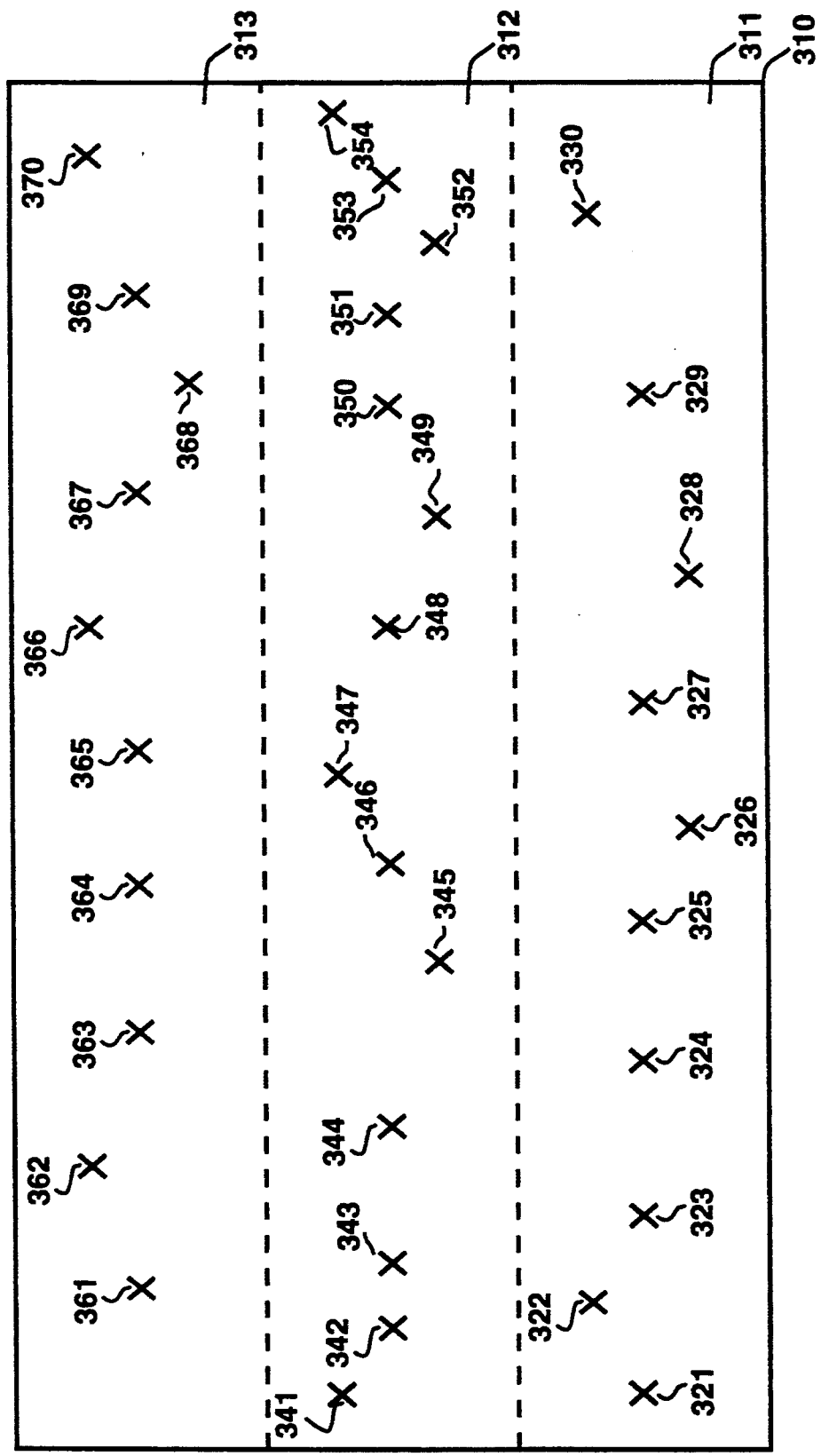
FIG. 6 is a simplified block diagram which illustrates variations within the regular location of intercell connectors in accordance with an alternate preferred embodiment of the present invention.

For example, FIG. 6 shows an integrated circuit 310 which is implemented using three layer metal gate array technology. Logic circuitry of integrated circuit 310 is arranged in logic circuitry rows. For example, a logic circuitry row 311, a logic circuitry row 312 and a logic circuitry row 313 are shown. Intercell connections between logic circuitry rows are routed in two metal layers which are placed on top of the logic circuitry rows.

As shown by FIG. 6, intercell connections are logic circuitry rows and are not all initially aligned. For example, within logic circuitry row 311 are an intercell connector 321, an intercell connector 322, an intercell connector 323, an intercell connector 324, an intercell connector 325, an intercell connector 326, an intercell connector 327, an intercell connector 328, an intercell connector 329 and an intercell connector 330. Similarly, within logic circuitry row 312 are an intercell connector 341, an intercell connector 342, an intercell connector 343, an intercell connector 344, an intercell connector 345, an intercell connector 346, an intercell connector 347, an intercell connector 348, an intercell connector 349, an intercell connector 350, an intercell connector 351, an intercell connector 352, an intercell connector 353 and an intercell connector 354. Within logic circuitry row 313 are an intercell connector 361, an intercell connector 362, an intercell connector 363, an intercell connector 364, an intercell connector 365, an intercell connector 366, an intercell connector 367, an intercell connector 368, an intercell connector 369 and an intercell connector 370.

Figure 7:
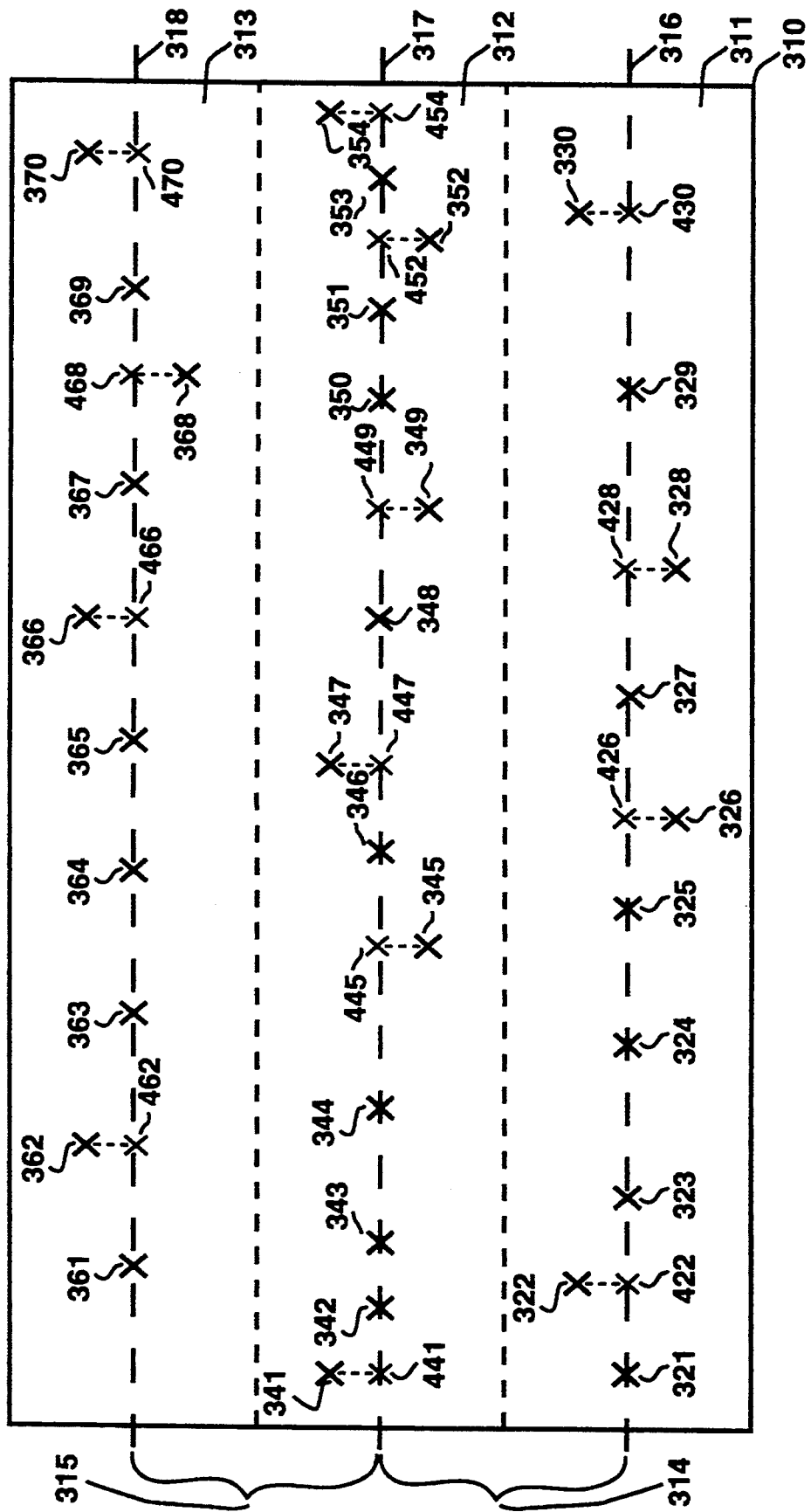
FIG. 7 is a simplified block diagram which illustrates placement of substitute connectors along defined routing channels in accordance with an alternate preferred embodiment of the present invention.

As shown by FIG. 7, routing channels may be defined for routing between the logic circuitry rows. For example, a routing channel 314 is defined between a channel boundary 316 and a channel boundary 317. A routing channel 315 is defined between a channel boundary 317 and a channel boundary 318.

Intercell connectors not already on a channel boundary are projected to one. For example, intercell connectors 321, 323,324,325,327,329 are already on channel boundary 316. Other intercell connectors in logic circuitry row 311 are projected to channel boundary 316. Substitute connector 422 is projected from intercell connector 322. Substitute connector 426 is projected from intercell connector 326. Substitute connector 428 is projected from intercell connector 328. Substitute connector 430 is projected from intercell connector 330.

Similarly, intercell connectors 342,343,344,346,348, 350,351 and 353 are already on channel boundary 317. Other intercell connectors in logic circuitry row 312 are projected to channel boundary 317. Substitute connector 441 is projected from intercell connector 341. Substitute connector 445 is projected from intercell connector 345. Substitute connector 447 is projected from intercell connector 347. Substitute connector 449 is projected from intercell connector 349. Substitute connector 449 is projected from intercell connector 349. Substitute connector 452 is projected from intercell connector 352. Substitute connector 454 is projected from intercell connector 354.

Likewise, intercell connectors 361, 363,364,365,367 and 369 are already on channel boundary 318. Other intercell connectors in logic circuitry row 313 are projected to channel boundary 318. Substitute connector 462 is projected from intercell connector 362. Substitute connector 466 is projected from intercell connector 366. Substitute connector 468 is projected from intercell connector 368. Substitute connector 470 is projected from intercell connector 370.

In the initial channel routing, the substitute connectors are routed instead of the intercell connectors not located on a routing channel boundary. If an intercell connector is to be routed within a first routing channel, but is actually located within a second routing channel, during the channel routing of the second routing channel, a routing segment between the intercell connector and its substitute connector is treated as an obstacle.

Figure 8:
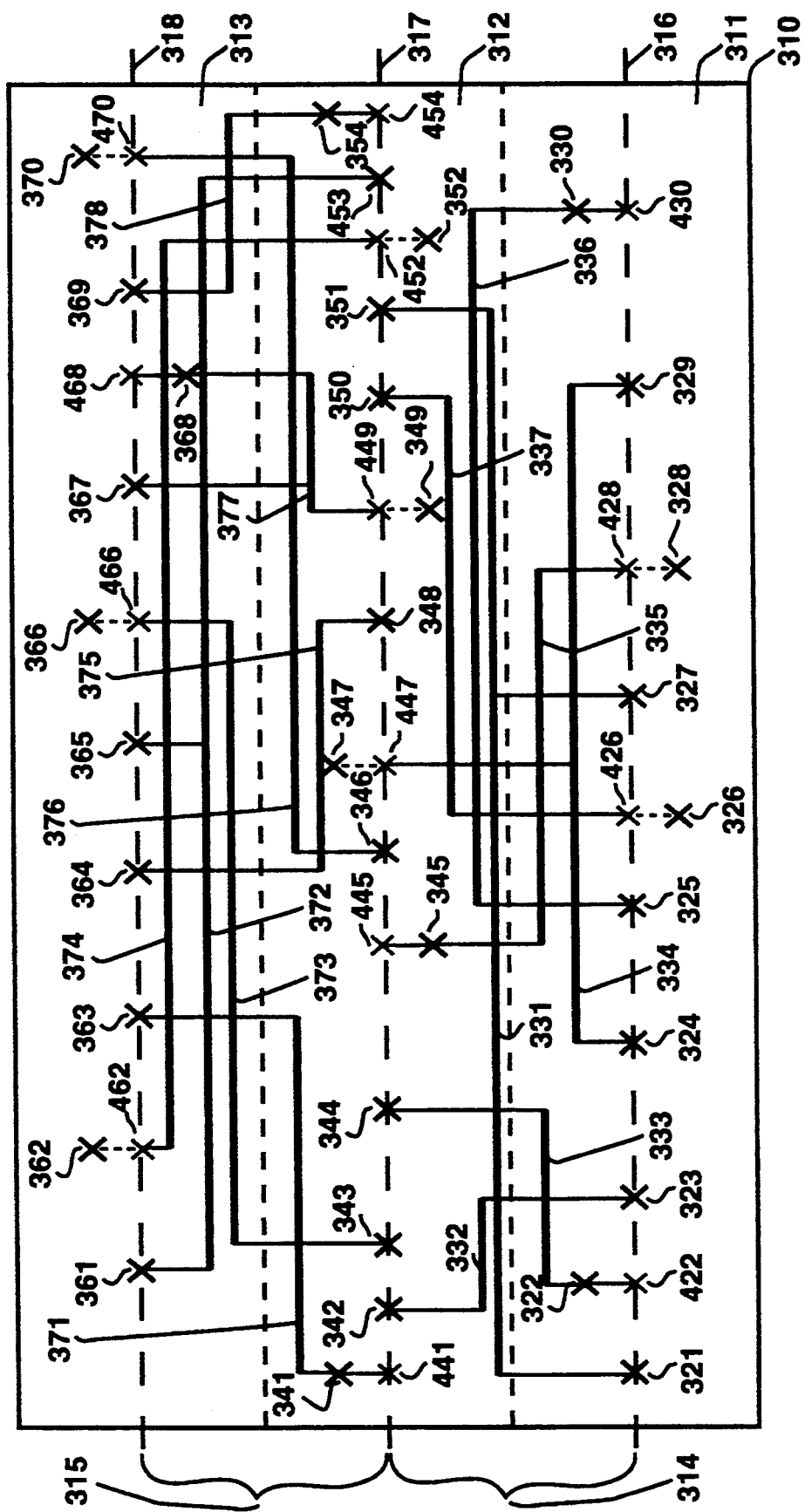
FIG. 8 is a simplified block diagram which illustrates routing of intercell connectors and substitute connectors, shown in FIG. 7, along defined routing channels in accordance with the alternate preferred embodiment of the present invention.

For example, as shown by FIG. 8, a channel router may is used to channel route intercell connectors and substitute connectors which are located along boundaries of routing channel 314 and routing channel 315.

For instance, in routing channel 314, a horizontal routing segment 331, a horizontal routing segment 332, a horizontal routing segment 333, a horizontal routing segment 334, a horizontal routing segment 335, a horizontal routing segment 336 and a horizontal routing segment 337 are shown. These horizontal routing segments are used to connect intercell connectors 321,323,324,325,327, 329 and substitute connectors 422,426,428,430 along channel boundary 316 with intercell connectors 342,344,347,350,351 and substitute connector 445 along channel boundary 317. A projected routing segment 381 between intercell connector 349 and substitute connector 449 is treated as an obstacle when routing channel 314. Also, a projected routing segment 382 between intercell connector 352 and substitute connector 452 is treated as an obstacle when routing channel 314.

Similarly, in routing channel 315, a horizontal routing segment 371, a horizontal routing segment 372, a horizontal routing segment 373, a horizontal routing segment 374, a horizontal routing segment 375, a horizontal routing segment 376, a horizontal routing segment 377 and a horizontal routing segment 378 are shown. These horizontal routing segments are used to connect intercell connectors 343,346,348,353 and substitute connectors 441,449,452,454 along channel boundary 317 with intercell connectors 361,363,364,365, 367,369 and substitute connectors 462,466,468,470 along channel boundary 318. A projected routing segment 383 between intercell connector 347 and substitute connector 447 is treated as an obstacle when routing channel 314.

Figure 9:
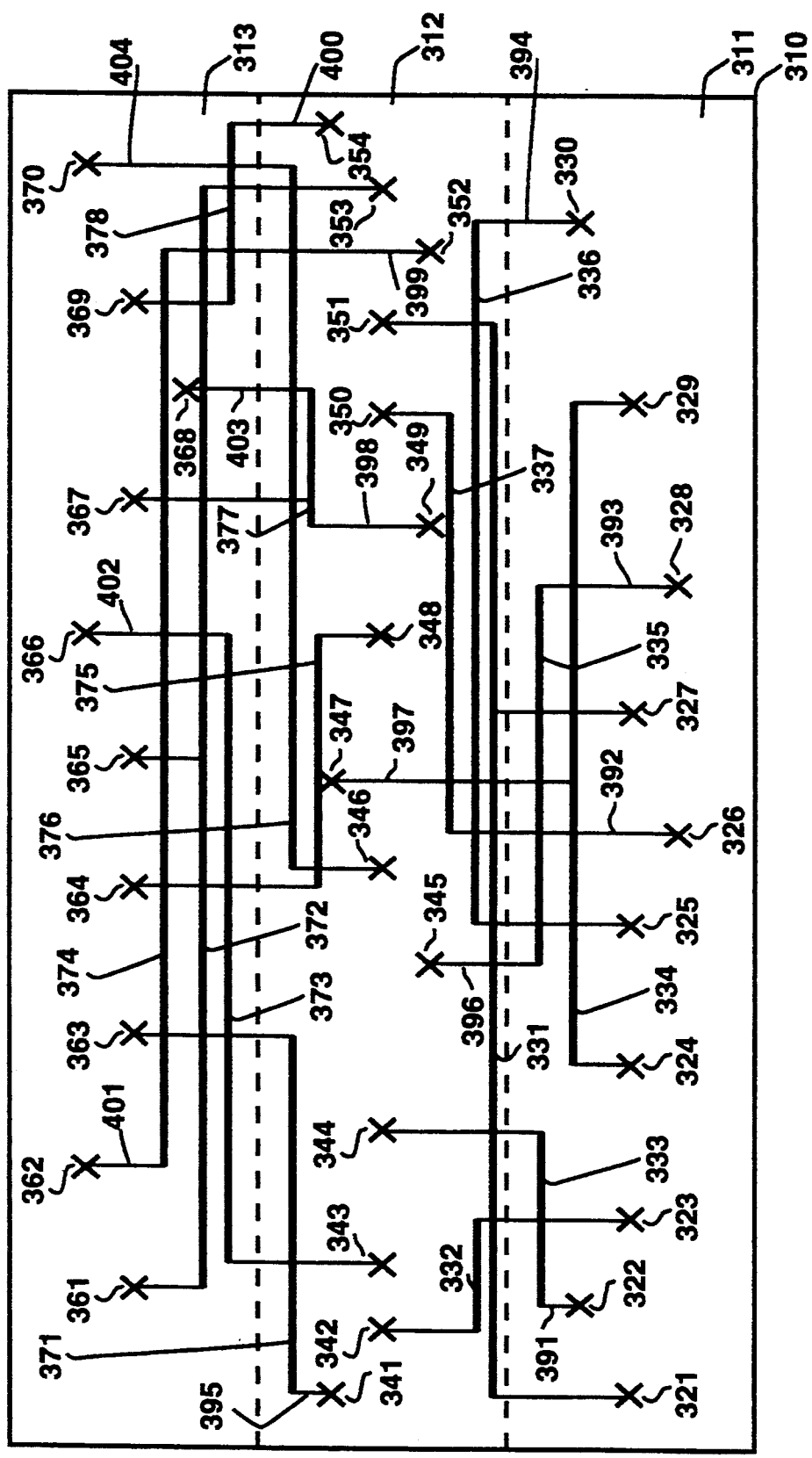
FIG. 9 is a simplified block diagram which illustrates complete routing of intercell connectors shown in FIG. 6, in accordance with the alternate preferred embodiment of the present invention.

Once channel routing is completed, vertical routing segments are adjusted so that they extend to intercell connectors rather than to substitute connectors. For example, as shown in FIG. 9, a vertical routing segment 391 has been shortened to extend to intercell connector 322. A vertical routing segment 392 has been lengthened to extend to intercell connector 326. A vertical routing segment 393 has been lengthened to extend to intercell connector 328. A vertical routing segment 394 has been shortened to extend to intercell connector 330. A vertical routing segment 395 has been shortened to extend to intercell connector 341. A vertical routing segment 396 has been shortened to extend to intercell connector 345. A vertical routing segment 397 has been lengthened to extend to intercell connector 347. A vertical routing segment 398 has been lengthened to extend to intercell connector 349. A vertical routing segment 399 has been lengthened to extend to intercell connector 352. A vertical routing segment 400 has been shortened to extend to intercell connector 354. A vertical routing segment 401 has been lengthened to extend to intercell connector 362. A vertical routing segment 402 has been lengthened to extend to intercell connector 366. A vertical routing segment 403 has been shortened to extend to intercell connector 368. A vertical routing segment 404 has been lengthened to extend to intercell connector 370.

The method of the present invention may be implemented in by a computer used in the design of large scale integrated circuits.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for providing routing between logic cells, the method comprising the steps of:
   (a) defining boundaries of routing channels to be placed in two metal layers above the logic cells;
   (b) placing intercell connectors within the logic cells so that the intercell connectors are on the boundaries of the routing channels; and,
   (c) channel routing the intercell connectors within the routing channels.

2. A method as in claim 1 wherein the logic cells are arranged in rows and in step (a) the boundaries of the plurality of routing channels are defined so that the routing channels are parallel to the rows and the boundaries of the routing channels are in the middle of the rows.

3. A method for providing routing between logic cells, the method comprising the steps of:
   (a) defining boundaries of a plurality of routing channels to be placed in two metal layers above the logic cells;
   (b) placing intercell connectors within the logic cells;
   (c) for each intercell connector which is not on a boundary of a routing channel, projecting a substitute connector at the boundary of a routing channel;
   (d) channel routing the substitute connectors and the intercell connectors which are on the boundaries of the routing channels; and,
   (e) adjusting length of routing segments routed in step (d) to extend to the intercell connectors placed in step (b).

4. A method as in claim 3 wherein step (d) includes the substeps of:
   (d.1) routing within a first routing channel from the plurality of routing channels, a first substitute connector, the first substitute connector being projected from a first intercell connector, the first intercell connector being located in a second routing channel; and,
   (d.2) routing the second routing channel, the routing including treating a projected routing path from the first substitute connector to the intercell connector as an obstacle.

5. A method as in claim 4 wherein the logic cells are arranged in rows and in step (a) the boundaries of the plurality of routing channels are defined so that the routing channels are parallel to the rows and the boundaries of the routing channels are in the middle of the rows.

6. A method as in claim 3 wherein the logic cells are arranged in rows and in step (a) the boundaries of the plurality of routing channels are defined so that the routing channels are parallel to the rows and the boundaries of the routing channels are in the middle of the rows.

7. A method for providing routing between logic cells, the method comprising the steps of:
   (a) arranging the logic cells in rows;
   (b) aligning intercell connectors within each row of logic cells, the intercell connectors within each row being aligned in a direction parallel to the row, the intercell connectors not being aligned on boundaries of the rows of logic cells;
   (c) channel routing the intercell connectors in metal layers above the logic cells, the aligned intercell connectors within each row forming channel boundaries for channel routing.

8. A method as in claim 7 wherein in step (b) the intercell connectors are in the middle of the rows.

* * * * *